United States Patent
Ogata et al.

(10) Patent No.: US 6,623,986 B2
(45) Date of Patent: Sep. 23, 2003

(54) METHOD OF MANUFACTURING A FERROELECTRIC MEMORY DEVICE

(75) Inventors: Kiyoshi Ogata, Yokohama (JP); Kazuhiko Horikoshi, Kawasaki (JP); Kazufumi Suenaga, Yokohama (JP); Hisayuki Kato, Kokubunji (JP); Keiichi Yoshizumi, Kokubunji (JP); Masahito Yamazaki, Hinode-machi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/984,465

(22) Filed: Oct. 30, 2001

(65) Prior Publication Data

US 2002/0022279 A1 Feb. 21, 2002

Related U.S. Application Data

(63) Continuation of application No. 09/331,670, filed on Jun. 23, 1999, now Pat. No. 6,316,798.

(30) Foreign Application Priority Data

Dec. 25, 1996 (JP) ............................ P08-344982

(51) Int. Cl.⁷ .............................................. H01L 21/00
(52) U.S. Cl. ................................................... 438/3
(58) Field of Search ........................... 438/3, 502, 509, 438/522, 530, 540, 715; 316/313; 257/295

(56) References Cited

U.S. PATENT DOCUMENTS

| | | | | |
|---|---|---|---|---|
| 5,191,510 A | * | 3/1993 | Huffman | 361/313 |
| 5,389,606 A | * | 2/1995 | Face | 505/473 |
| 6,020,233 A | | 2/2000 | Kim | 257/295 |
| 6,194,751 B1 | | 2/2001 | Evans, Jr. | 257/295 |
| 6,229,166 B1 | | 5/2001 | Kim et al. | 257/295 |
| 6,246,082 B1 | | 6/2001 | Mitarai et al. | 257/295 |

FOREIGN PATENT DOCUMENTS

| | | |
|---|---|---|
| JP | 4-102367 | 4/1992 |
| JP | 5-63205 | 3/1993 |
| JP | 6-200366 | 7/1994 |
| JP | 6-290983 | 10/1994 |
| JP | 7-111318 | 4/1995 |
| JP | 7-273297 | 10/1995 |

OTHER PUBLICATIONS

Tamaoki et al. "The Effect of Airborne Contaminants in the Cleanroom of ULSI Manufacturing Process" IEEE/SEMI Adv. Manufacturing Conference 1995, pp. 322–326.*

Takada et al. "Evaluation of Organic Contamination in Cleanroom and Deposition onto Wafer Surface" 1998 proceedings Institute of Environmental Sciences on Technology, pp. 556–560.*

Hirata, Kazuo, Japanese Abstract Publication No. JP407109562A, "Formation of PZT Thin Film." Apr. 25, 1995.*

Collins et al. , Derwent Abstracted Publication No. US 5443688A, "Pattern etching a film of lead zirconium titanium oxide material . . . " Aug. 22, 1995.*

* cited by examiner

*Primary Examiner*—Craig Thompson
(74) *Attorney, Agent, or Firm*—Antonelli, Terry, Stout & Kraus, LLP

(57) ABSTRACT

Along life ferroelectric memory device using a thin ferroelectric film capacitor as a memory capacitor is obtained by disposing a plurality of degradation preventive layers on an upper protection electrode and an upper electrode 8 and a degradation preventive layer at the boundary of ferroelectric layer 7/electrodes 6, 8, or providing a step of decreasing a modified layer at the boundary of ferroelectric layer 7/upper electrode 8. This provides a thin ferroelectric film capacitor which is subjected to less fatigue and imprinting and which has less degradation of ferroelectric characteristic to attain a long life ferroelectric memory device.

2 Claims, 6 Drawing Sheets

- 30: Encapsulation region
- 28: Interlayer insulation layer
- 29: Protection layer
- 9: Wiring layer
- 8: Upper electrode
- 6: Lower electrode
- 7: Ferroelectric layer
- 5: Adhesion layer
- 3: Insulation layer
- 2: LSI Underlying LSI
- 1: Si Substrate

- 22: Upper protection electrode
- 8: Upper electrode
- 7: Ferroelectric layer
- 6: Lower electrode
- 5: Adhesion layer
- 3: Insulation layer
- 2: Underlying LSI

- 23: Barrier layer
- 9: Wiring layer
- 28: Interlayer insulation layer
- 8: Upper electrode
- 7: Ferroelectric layer
- 6: Lower electrode
- 5: Adhesion layer
- 3: Insulation layer
- 2: Underlying LSI

- 8: Upper electrode
- 21: Upper degradation preventive layer
- 7: Ferroelectric layer
- 20: Lower degradation preventive layer
- 6: Lower electrode
- 5: Adhesion layer
- 3: Insulation layer
- 2: Underlaying LSI

METHOD OF MANUFACTURING A FERROELECTRIC MEMORY DEVICE

This is a continuation of application Ser. No. 09/331,670, filed Jun. 23, 1999. Now U.S. Pat. No. 6,316,798.

TECHNICAL FIELD

The present invention concerns a capacitor formed with a thin ferroelectric film, a memory device using the capacitor and a capacitor for preventing unnecessary electromagnetic radiation for a CPU, or an on-chip capacitor for use in a circuit-mounted substrate and, more particularly, the invention relates to a ferroelectric memory device applicable to a non-volatile memory and a manufacturing method thereof.

BACKGROUND OF THE INVENTION (1) Conventional thin ferroelectric film capacitors have a laminate is structure consisting of a Pt upper electrode/ferroelectric layer (PZT)/Pt lower electrode as described, for example, in "Thin Ferroelectric Film Memory" (published by Science Forum (1995), p 227).

(2) Further, in "Method of Forming a Thin Film" described, for example, in Japanese Patent Unexamined Publication Hei 7-142600, a compound $BaTiO_3$ is formed on a thin Pt film, while the crystal orientation of the thin Pt film is reflected therein as it is, thereby making it possible to easily control the orientation property of the thin ferroelectric film and control the degree of residual dielectric polarization.

(3) Further, in "Method of Manufacturing a Thin ferroelectric film" described, for example, in Japanese Patent Unexamined Publication Hei 7-57535, a thin film of a perovskite type ferroelectric composition is formed on a substrate, on which a thin film of a perovskite type oxide composition solid solubilizable with the thin film of the perovskite type ferroelectric composition is formed, and a thin film comprising two layers consisting of a thin film of the ferroelectric composition and a thin film of the perovskite type oxide composition is subjected to a heat treatment to solid solubilize and crystallize them, to attain a method of manufacturing a thin ferroelectric film free from the formation of other phases than the perovskite phase and with a uniform crystal grain size.

The conventional capacitor described above in publication (1) involves a problem that the ferroelectric property thereof has a film thickness dependence and no sufficient characteristic can be obtained at a film thickness of 200 nm or less.

Further, as a problem inherent to the thin ferroelectric film capacitor, there is a film fatigue problem in that the dielectric polarizing characteristic is degraded and writing can not be accomplished with repeated reversion of the dielectric polarization many times, as well as an imprinting phenomenon which occurs when it is left polarized in one direction for a long time without conducting rewriting.

Further, the methods described in (2) and (3) involve a problem in that two kinds of thin films of perovskite crystals of quite different compositions have to be formed and this complicates the film-forming apparatus.

An object of the present invention is to provide a ferroelectric memory device which is subject to less film fatigue and imprinting and which has a long life, as well as a method of manufacturing such a device.

SUMMARY OF THE INVENTION

The object of the present invention can be attained by using a Pt electrode as an upper electrode of a thin ferroelectric film capacitor, and by disposing a metal or metal oxide electrode containing TiN, Pt, Ir or Ru above the Pt electrode as an upper protection electrode. Decomposed gases, which have evolved from materials present in the upper electrode or the wiring layer and the insulation layer formed on the upper protection electrode and which are present in the encapsulation resin in absorbed or interrupted form, serve to prevent degradation of the crystal structure caused by reduction, decomposition or formation into amorphous forms of the ferroelectric material and prevent lowering of the residual dielectric polarization value Pr. This can provide a ferroelectric memory device of high quality with a residual dielectric polarization value Pr between the upper electrode and the lower electrode of the capacitor of 1E-6C/$cm^2$ or more, by heating, for example, to a temperature of 85° C. or higher, maintaining the temperature for more than 90 min, then lowering the temperature to room temperature, applying a bias voltage of 1.0V to 3.5V between the upper electrode and the lower electrode, and then reducing the bias voltage to 0 V after manufacturing at least the wiring layer and the protection layer of the ferroelectric memory device, or, in addition, after encapsulating them in a package using a encapsulation resin, as an acceleration test for inspecting the reliability.

Further, the foregoing object can be attained by forming a barrier layer comprising $SiO_2$ or $Si_3N_4$ above the upper electrode or the upper protection electrode of the thin ferroelectric film capacitor, reducing the number of hydrogen atoms contained in hydrocarbon compounds bonded to the barrier layer to 2.5E 17/$cm^2$ or less, thereby reducing hydrogen evolved from the inside of the barrier layer during the processing step, and, further, chemically absorbing or physically interrupting decomposed gases evolved from the materials included in the protection layer and the wiring layer formed on the upper electrode and present in the encapsulation resin, thereby preventing degradation of the crystal structure caused by reduction, decomposition or formation into of the ferroelectric material into an amorphous form and preventing lowering of the residual dielectric polarization value Pr.

Further, the foregoing object can be attained by forming the barrier layer by a sputtering method or a laser abrasion method, reducing the partial pressure of hydrogen present in the atmosphere during the film-forming upon forming the barrier layer, and decreasing the impurity hydrocarbons contained in the barrier layer, thereby preventing degradation of the crystal structure caused by reduction, decomposition or formation the ferroelectric material into an amorphous form and preventing lowering of the residual dielectric polarization value Pr.

Further, the foregoing object can be attained by a method comprising a step of forming a thin amorphous film and a crystallizing step using heat treatment in oxygen as a step of manufacturing a thin ferroelectric film of the thin ferroelectric film capacitor, removing the surface layer of the thin ferroelectric film at least by nm using an ion etching method after the crystallizing step and forming the film of the upper electrode while keeping the ferroelectric film in a vacuum without exposing it to atmospheric air, thereby decreasing a modified layer at the boundary between the ferroelectric film and the upper electrode and thereby preventing lowering of the residual dielectric polarization value Pr.

Further, the foregoing object can be attained by a thin ferroelectric film capacitor having a laminate structure comprising, on a substrate, at least a lower electrode, a thin Pb(Zr, Ti)O$_3$ film and an upper electrode in which a Pb excess ferroelectric layer is disposed at the boundary between the lower electrode and the thin ferroelectric film, and the compositional molar ratio of the Pb excess ferroelectric layer is defined as:

Pb:Zr:Ti:0=(1+y):(1-x):x:(3-z)

(0<y<0.3, 0.3<x<0.7, -0.1<z<0.1), thereby previously compensating the amount of Pb in the ferroelectric material at the electrode boundary upon diffusion into the electrode or reaction with the electrode.

Further, the foregoing object can be attained by forming a thin ferroelectric film layer without exposing the substrate to atmospheric air after the step of forming the lower electrode for forming a thin film of the lower electrode on the substrate in a vacuum vessel.

Further, the foregoing object can be attained by irradiating UV-rays in an oxygen atmosphere between the step of forming the lower electrode and the step of forming the thin ferroelectric film, during the manufacture of the thin ferroelectric film capacitor, thereby removing organic contaminates on the surface of the lower electrode.

Further, the foregoing object can be attained by forming the thin ferroelectric film in a vacuum, and forming a Pb excess ferroelectric layer by controlling the substrate temperature in the film-forming step, thereby controlling the Pb composition in the ferroelectric material.

Further, the foregoing object can be attained by a method comprising a step of preparing a thin ferroelectric film by a sputtering method, and forming a Pb excess ferroelectric layer by controlling the gas pressure or the electric power applied in the film-forming step, thereby controlling the Pb composition in the ferroelectric material.

Further, the foregoing object can be attained by a method comprising a step of preparing a ferroelectric thin film by a sputtering method, using a sintered mixture only composed of a ferroelectric material and a lead oxide as a target in the film-forming step and, further, defining the average crystal grain size of the target as 100 nm or more.

Further, the foregoing object can be attained by a method comprising a step of preparing the thin ferroelectric film by a multi-cathode type sputtering method in the step of preparing the thin ferroelectric film capacitor, using a sintered ferroelectric material as a first target in the film-forming step, further using a sintered lead oxide as a second target, and forming a Pb access ferroelectric layer by varying the electric power applied on every target in the film-forming step, thereby controlling the Pb composition in the ferroelectric material.

BEST MODE FOR PRACTICING THE INVENTION

Figure 1:
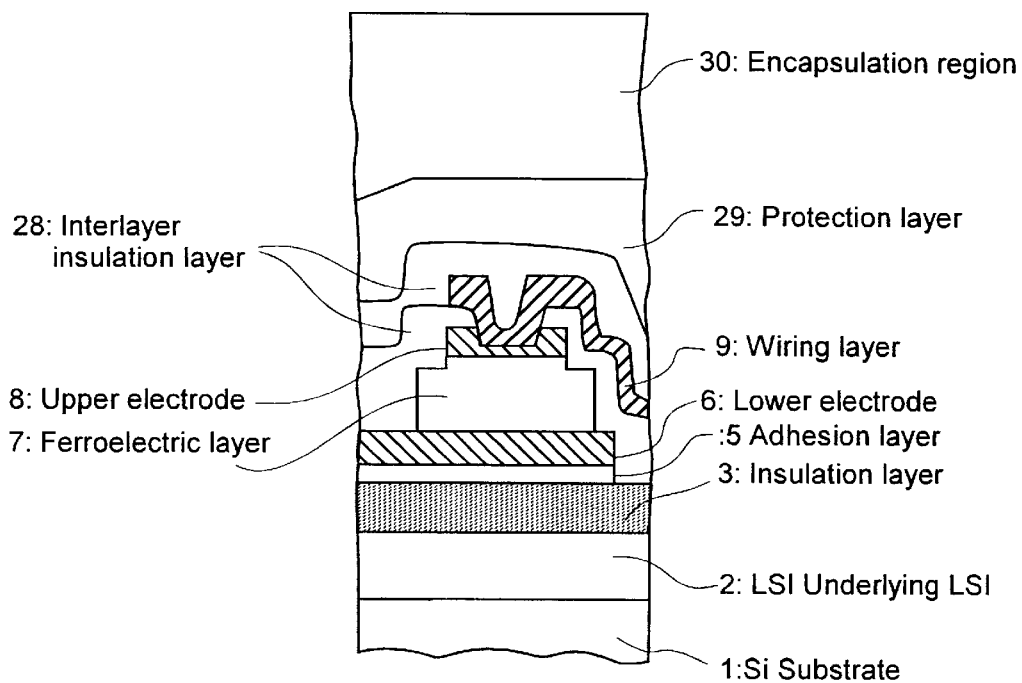
FIG. 1 is a diagrammatic cross sectional view showing an outline of a ferroelectric capacitor portion in a ferroelectric memory device representing an embodiment according to the present invention.

Preferred embodiments of the present invention will be explained with reference to the drawings. FIG. 1 is a cross sectional view showing an outline of a ferroelectric memory device representing an embodiment according to the present invention. A ferroelectric capacitor has a laminate structure comprising an underlying LSI layer 2 on an Si substrate 1, an insulation layer 3 (300 nm), an adhesion layer 5 (20 m), a lower electrode 6 (200 nm), a ferroelectric material Pb (1+y) (Zr1-x, Ti$_x$)0$_3$ layer 7 (260 nm), and an upper electrode 8 (10 nm). Interlayer insulation layer 28 and a wiring layer 9 are laminated on the capacitor to provide wiring for the capacitor electrodes 6 and 8, and a transistor provided in the underlying LSI 2. Further, a protection layer 29 comprising SiO$_2$ or the like is formed on an upper portion and packaging is applied with an encapsulation resin 30. After manufacture in this form, inspection is conducted in the form of an acceleration test for examining the reliability by heating the structure at least to 85° C. or higher, maintaining the temperature for 92 min or more and then lowering the temperature to room temperature. This embodiment provides a memory device in which a memory device chip portion and a TEG (chip designed for test) are present together in one sheet of a wafer. Wiring is applied from the upper electrode 8 and the lower electrode 6 in the TEG to electrodes for inspection provided respectively for enabling inspection. A voltage is applied between the electrodes and the residual dielectric polarization value Pr is measured by a method, for example, as described in the above-referenced publication 1 to confirm that the value is 1E-6C/cm$^3$ or more.

Figure 2:
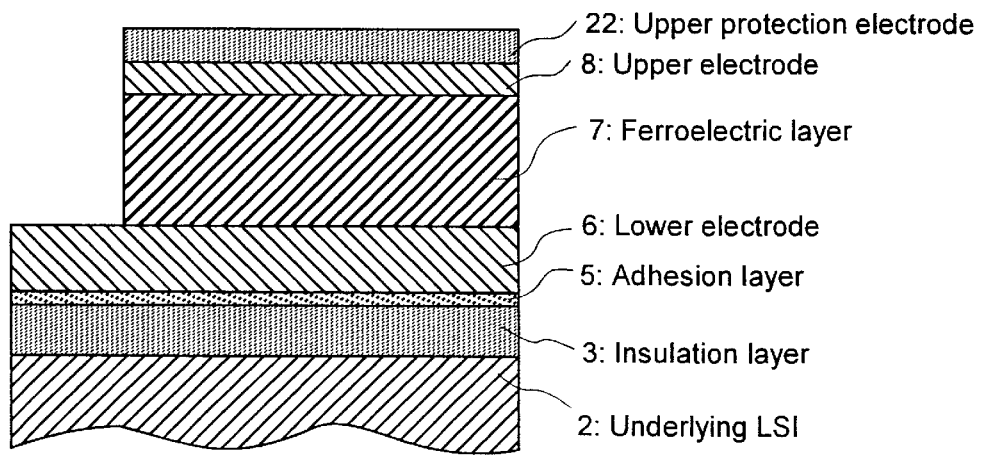
FIG. 2 is a cross sectional view showing an outline of an upper protection electrode in a ferroelectric capacitor in a ferroelectric memory device representing another embodiment according to the present invention.

FIG. 2 is a cross sectional view showing an outline of an upper protection electrode in a ferroelectric capacitor in a ferroelectric memory device representing another embodiment of the present invention. An upper protection electrode 22 is formed on the upper electrode shown in FIG. 1. A Pt electrode is used for the upper electrode 8, and Pt 0.9 and an Ir 0.1:Pt 0.9 alloy is used for the upper protection electrode 22. The upper protection electrode 22 may also be made of metallic Ir or Ru, or an alloy of Zr and Ru. Further, the alloy may contain Pt and may be an oxide of the electrode described above. This constitution can absorb hydrogen or the like released during the manufacturing step from the interlayer insulation layers 28 and the protection layer 29 formed on the upper protection electrode 22, to prevent degradation of the ferroelectric layer by reduction, decomposition and formation to an amorphous form. Further, degradation of the crystal structure of the ferroelectric material is prevented, to prevent lowering of the residual dielectric polarization value Pr, by absorption or interruption of decomposed gases evolved during the resin encapsulating step.

Figure 3:
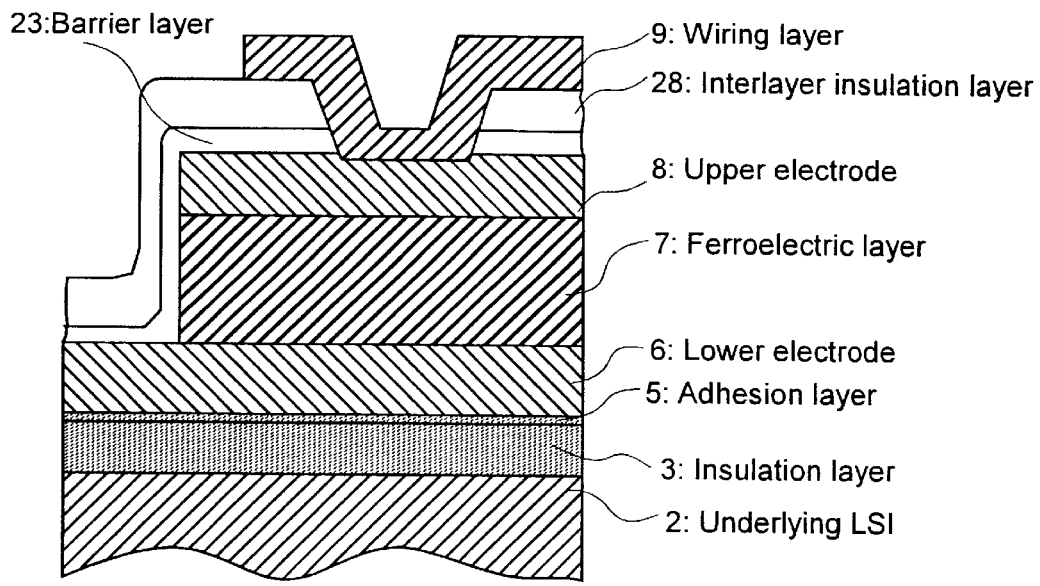
FIG. 3 is a cross sectional view showing an outline of a ferroelectric capacitor and a barrier layer in a ferroelectric memory device representing a further embodiment according to the present invention.

FIG. 3 is a cross sectional view showing an outline of a ferroelectric capacitor and a barrier layer in a ferroelectric memory device representing a further embodiment of the present invention.

A barrier layer 23 made, for example, of $SiO_2$ or $Si_3N_4$ is formed above the upper electrode 8 or the upper protection electrode 22. This chemically absorbs or physically interrupts the decomposed gases evolved from materials including the protection layer 29, the interlayer insulation layers 28 and the like formed on the upper electrode and present in the encapsulation resin 30, thereby preventing degradation of the crystal structure of the ferroelectric layer 7 caused by reduction, decomposition and formation to an amorphous form and preventing lowering of the residual dielectric polarization value Pr.

Figure 4:
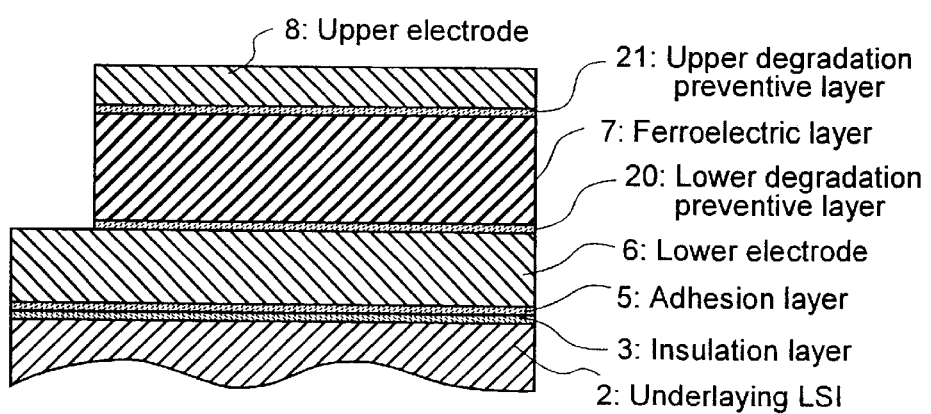
FIG. 4 is a cross sectional view showing an outline of degradation preventive layers of a ferroelectric capacitor portion in a ferroelectric memory device representing a further embodiment according to the present invention.

FIG. 4 is a cross sectional view showing an outline of degradation preventive layers in a ferroelectric capacitor portion of a ferroelectric memory device representing a further embodiment of the present invention. A lower degradation preventive layer 20 is disposed at the boundary between the lower electrode 6 and the ferroelectric layer 7, and an upper degradation preventive layer 21 is disposed at the boundary between the ferroelectric layer 7 and the upper electrode 8. A Pb excess ferroelectric layer (10 nm) is used for the degradation preventive layers. Reference numeral 5 denotes an adhesion layer between the insulation layer $(SiO_2)_3$ and the lower electrode 6. While it is defined as: y=0.1 and X is 0.5 in this embodiment, they may be varied in accordance with desired dielectric polarization characteristic or the like. Further, for improving the fatigue characteristic, a plurality of minor ingredients can be added. Further, while the upper degradation preventive layer 21 is disposed at the boundary between the ferroelectric layer 7 and the upper electrode 8 in this embodiment, it may be saved depending on the process conditions, such as the annealing temperature in the subsequent step. In this embodiment, while Pt is used for the upper electrode 6 and the lower electrode 8, Ir, Ru or an alloy of such metals, as well as a thin film of oxides comprising an alloy or a single ingredient thereof may also be used.

Figure 5:
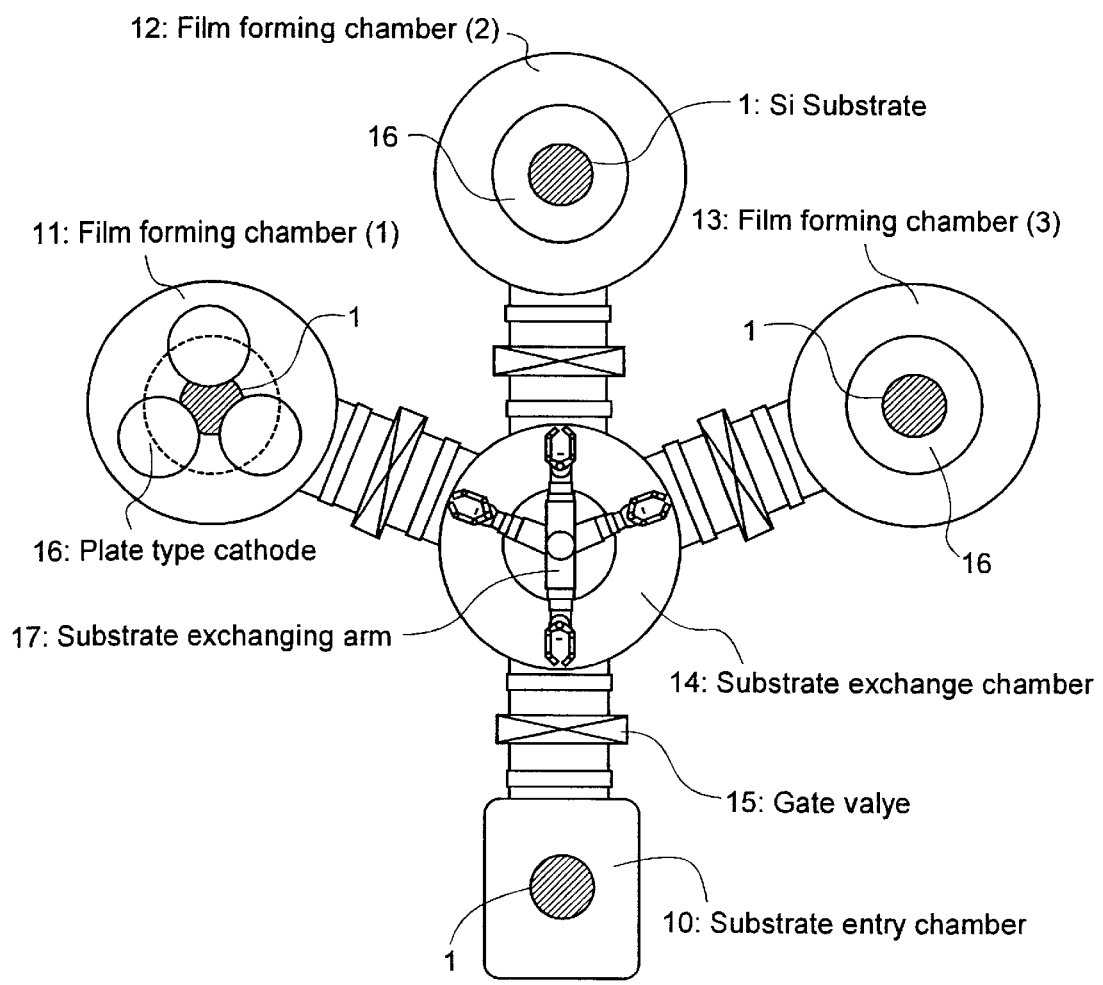
FIG. 5 is a block diagram showing an example of a film-forming apparatus for manufacturing a ferroelectric capacitor in a ferroelectric memory device according to the present invention.

FIG. 5 shows an example of a film-forming apparatus for manufacturing a thin ferroelectric film capacitor according to the present invention. A substrate 1 introduced through a substrate entry chamber 10 is transported by way of a substrate exchanging chamber 14 between each of a film-forming chamber (1)11, a film-forming chamber (2) 12 and a film-forming chamber (3) 13 by a substrate exchanging arm 17 under a high vacuum atmosphere. A high frequency magnetron sputtering system is used, with a multi-cathode type being used for the film-forming chamber (1) and a single cathode type being used for the film-forming chambers (2)12 and (3)13.

In this embodiment, the Ti layer 2 and the Pt lower electrode 6 are formed, respectively, in the film-forming chambers 2 (12) and (3) 13 and, further, the Pb excess layers 20 and 21 and the ferroelectric layer 7 are formed in the film-forming chamber (1). After forming the films in each of the film-forming chambers, thin films are formed continuously in other film-forming chambers without exposing the surface of the films to atmospheric air, by which film formation of good quality with less contamination the boundaries can be attained.

In the film-forming step for the ferroelectric layer 7, the Pb composition of the ferroelectric material to be formed into a film can be controlled by using a sintered ferroelectric PZT material for the first target and a sintered lead oxide PBO material for the second target, and by changing the electric power to be applied for every target, lower and upper degradation preventive layers 20 and 21 can be formed at the boundaries. In this embodiment, the composition for the Pb excess layer is defined as y=0.4.

In this embodiment, while the multi-cathode type sputtering apparatus was used for forming the films of the ferroelectric layer 7 and the lower and upper degradation preventive layers 20 and 21, a single cathode type may also be used. In this case, a mixed sintered material comprising only the ferroelectric material PZT and the lead oxide PBO need be used as the target.

Figure 6:
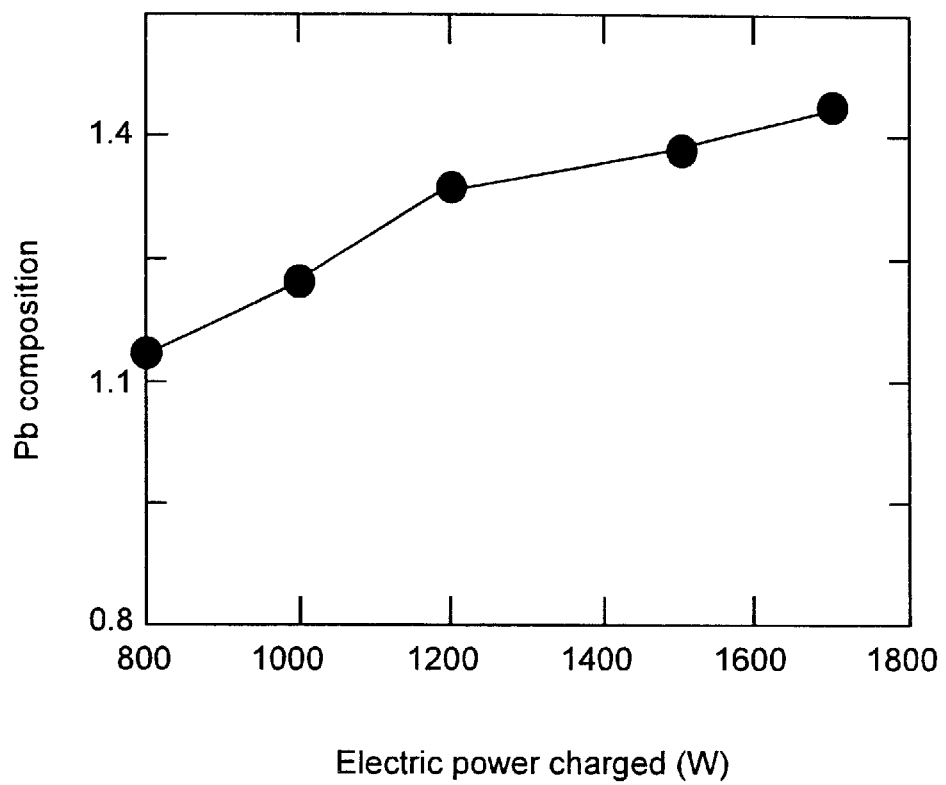
FIG. 6 is a chart showing an embodiment of a relationship between a Pb composition of a PZT ferroelectric material and an electric power charged for sputtering.

FIG. 6 is a chart showing a relationship between the PB composition of the PZT ferroelectric layer 7 formed by using the film-forming apparatus of this embodiment and electric power applied for sputtering. When application power is controlled in this way, the Pb composition of the ferroelectric layer 7 can be controlled. In the same manner, when the substrate temperature or the gas pressure is controlled, the Pb composition of the ferroelectric layer 7 can be controlled. By the methods described above, the upper degradation preventive layer 21 can be formed at the boundary.

Figure 7:
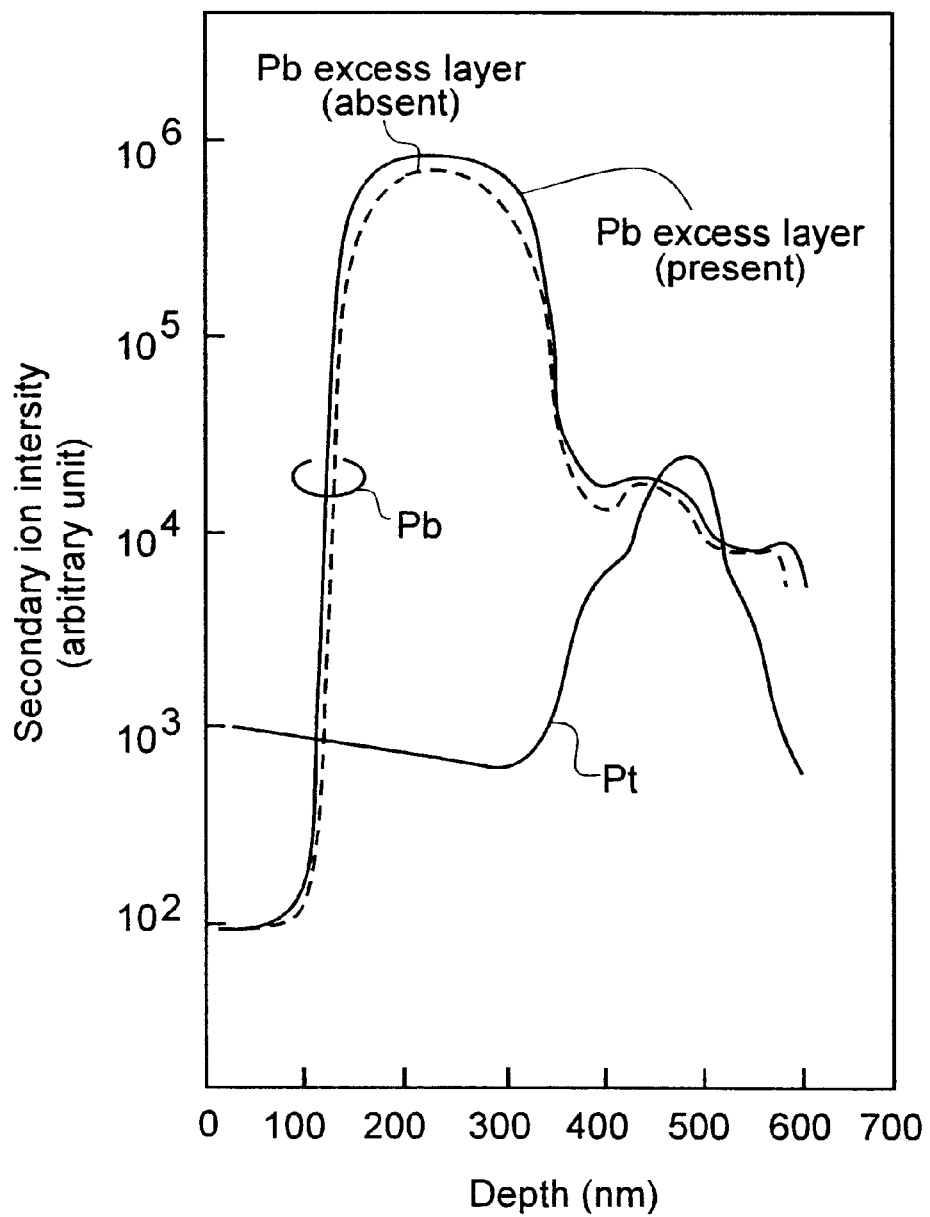
FIG. 7 is a chart showing a distribution of a composition in a cross section of a ferroelectric capacitor in a ferroelectric memory device representing an embodiment of the present invention.

FIG. 7 shows an example of a measurement by SINS for the compositional distribution in a cross section of a thin ferroelectric film capacitor representing an embodiment of the present invention. Solid lines are for the compositional distribution when the upper degradation preventive layer 21 of the invention is disposed, while a broken line shows a case with no such layer. In the heat treatment step at high temperature after forming the film of the ferroelectric layer 7, Pb is lost by the diffusion of Pb from the electrode boundary to the electrode or reaction of Pb with the electrode, but the lost Pb can be compensated by previously disposing the upper degradation preventive layer 21.

Further, a ferroelectric layer 7 of good crystal orientation can be obtained by using a polycrystal target having an average crystal grain size of 100 nm or more as the target.

Figure 8:
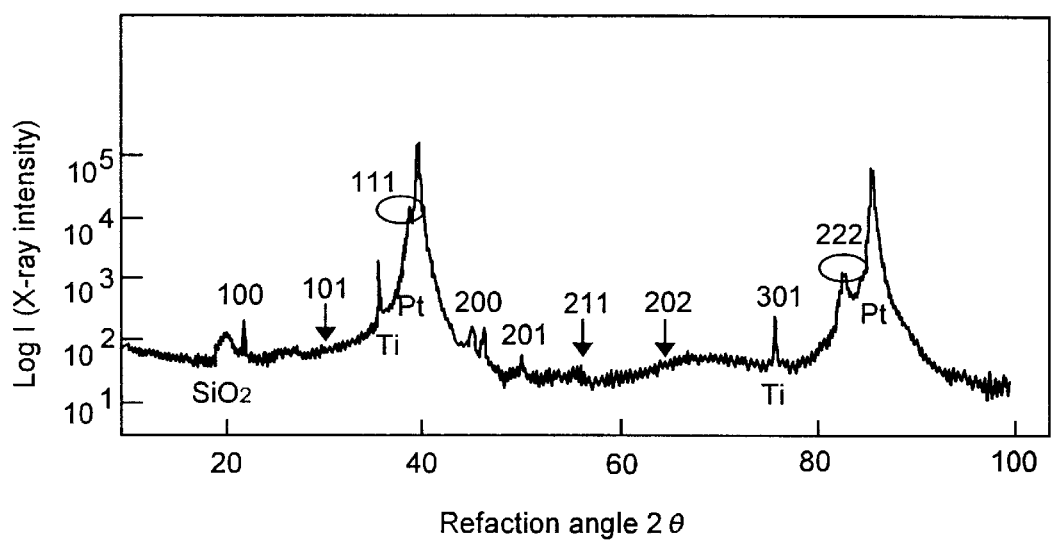
FIG. 8 is an X-ray diffraction chart for a ferroelectric capacitor in a ferroelectric memory device representing an embodiment of the present invention.

FIG. 8 is an X-ray diffraction chart for a thin ferroelectric film capacitor representing an embodiment of the present invention. This shows that a thin ferroelectric film capacitor with high (111) orientation and satisfactory dielectric polarization characteristic can be manufactured by the film-forming method of this embodiment.

As described above, in this embodiment, a thin ferroelectric film capacitor of good quality can be manufactured without exposing the surface of each film to atmospheric air by connecting a plurality of film forming chambers. When the film for each of the layers is formed by a separate film forming apparatus, the characteristics of the ferroelectric layer 7 can be improved by irradiating ultra-violet rays in an oxygen atmosphere between the step of forming the lower electrode 6 and the step of forming the ferroelectric layer 7, thereby removing any organic contaminate deposited on the surface of the lower electrode 6.

According to the present invention, a dielectric capacitor with less degradation during the process step and degradation during use can be realized, which dielectric capacitor can be utilized for super long life ferroelectric memory device.

What is claimed is:

1. A method of manufacturing a ferroelectric memory device having at least a wiring layer and an insulating layer on a thin ferroelectric film capacitor having a laminate structure, comprising at least a lower electrode, a thin ferroelectric film and an upper electrode, and an upper protection electrode comprising an alloy electrode, wherein the method comprises:

forming a thin amorphous film and crystallizing the thin amorphous film by a heat treatment in an oxygen containing atmosphere as a step of manufacturing a thin ferroelectric film of the thin ferroelectric film capacitor;

removing the surface layer of the thin ferroelectric film at least by 5 nm after the crystallizing step; and forming the film of the upper electrode on a surface of the thin ferroelectric film after the surface layer has been removed, wherein the steps of removing the surface layer of the thin ferroelectric film and forming the film of the upper electrode are performed in a vacuum without exposing the ferroelectric film to atmospheric air, thereby decreasing formation of a modified layer at a boundary between the ferroelectric film and the upper electrode.

2. A method according to claim 1 wherein the surface layer of the ferroelectric film is removed by an ion etching method.

* * * * *